United States Patent
Tan et al.

(10) Patent No.: US 10,338,149 B2
(45) Date of Patent: Jul. 2, 2019

(54) METHOD AND APPARATUS FOR CALCULATING SOC OF A BATTERY BEING CHARGED AND BATTERY PACK INCLUDING THE APPARATUS

(71) Applicant: Contemporary Amperex Technology Co., Limited, Ningde, Fujian (CN)

(72) Inventors: Li Tan, Ningde (CN); Yushuai Shi, Ningde (CN); Nana Xiong, Ningde (CN); Yanhua Lu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 39 days.

(21) Appl. No.: 15/720,151

(22) Filed: Sep. 29, 2017

(65) Prior Publication Data

US 2018/0106866 A1    Apr. 19, 2018

(30) Foreign Application Priority Data

Oct. 13, 2016  (CN) .......................... 2016 1 0892592

(51) Int. Cl.
*G01R 31/382* (2019.01)
*G01R 31/36* (2019.01)
(Continued)

(52) U.S. Cl.
CPC ......... *G01R 31/382* (2019.01); *G01R 19/165* (2013.01); *G01R 31/3646* (2019.01);
(Continued)

(58) Field of Classification Search
CPC .............. G01R 31/3606; G01R 19/165; G01R 31/3682; G01R 31/3675; G01R 31/362;
(Continued)

(56) References Cited

U.S. PATENT DOCUMENTS 5,761,072 A * 6/1998 Bardsley, Jr. ........ G01R 31/367
702/63
6,133,707 A * 10/2000 Kikuchi ................... B60K 6/28
320/104
(Continued)

FOREIGN PATENT DOCUMENTS

CN     103048626 A    4/2013
CN     103675701 A    3/2014
(Continued)

OTHER PUBLICATIONS

The First Official Action and search report dated Jul. 23, 2018 for Chinese application No. 201610892592.1, 8 pages.
(Continued)

*Primary Examiner* — M Baye Diao
(74) *Attorney, Agent, or Firm* — Law Offices of Liaoteng Wang

(57) ABSTRACT

A method and an apparatus for calculating the SOC of a battery being charged and a battery pack including the apparatus are disclosed in the present disclosure. The method for calculating the SOC includes: obtaining a full charge voltage and a reference charging voltage curve of the battery; taking a voltage value from the approximately linear ascent stage of the reference charging voltage curve as a preset reference voltage, and obtaining a corresponding reference SOC; acquiring a current charging voltage at which a charging voltage curve corresponding to a current charging state of the battery enters into an approximately linear ascent stage; determining a compensation factor according to the preset reference voltage, the full charge voltage, and the current charging voltage; and utilizing the compensation factor and the reference SOC to calculate a current SOC corresponding to the current charging state of the battery.

13 Claims, 5 Drawing Sheets

(51) Int. Cl.
*G01R 19/165* (2006.01)
*H01M 10/42* (2006.01)
*H01M 10/48* (2006.01)
*H02J 7/00* (2006.01)
*H02J 7/16* (2006.01)
*G01R 31/3835* (2019.01)
*G01R 31/374* (2019.01)

(52) U.S. Cl.
CPC ....... *G01R 31/374* (2019.01); *G01R 31/3835* (2019.01); *H01M 10/4257* (2013.01); *H01M 10/48* (2013.01); *H02J 7/0047* (2013.01); *H02J 7/16* (2013.01)

(58) Field of Classification Search
CPC ...... H02J 7/16; H02J 7/0047; H01M 10/4257; H01M 10/48
USPC .......................................................... 320/132
See application file for complete search history.

(56) References Cited

U.S. PATENT DOCUMENTS

| | | | | |
|---|---|---|---|---|
| 6,310,462 B1* | 10/2001 | Arai | ................... | G01R 31/3842 320/132 |
| 6,366,054 B1* | 4/2002 | Hoenig | ................. | H02J 7/0047 320/132 |
| 6,441,586 B1* | 8/2002 | Tate, Jr. | ............. | G01R 31/3648 320/132 |
| 6,469,512 B2* | 10/2002 | Singh | ................... | G01R 31/392 324/426 |
| 6,522,148 B2* | 2/2003 | Ochiai | ................. | G01R 31/374 324/428 |
| 6,534,954 B1* | 3/2003 | Plett | ..................... | G01R 31/367 320/132 |
| 6,639,385 B2* | 10/2003 | Verbrugge | ......... | G01R 31/3835 320/132 |
| 6,646,419 B1* | 11/2003 | Ying | ..................... | B60W 10/26 320/132 |
| 6,674,266 B2* | 1/2004 | Koch | ................... | G01R 31/374 320/132 |
| 6,700,383 B2* | 3/2004 | Kimura | ................... | B60L 58/12 324/429 |
| 6,789,026 B2* | 9/2004 | Barsoukov | ........... | G01R 31/367 702/63 |
| 6,809,501 B2* | 10/2004 | Kapsokavathis | ..... | H02J 7/1469 320/132 |
| 8,198,867 B2* | 6/2012 | Toyota | .................. | H02J 7/0057 320/132 |
| 2013/0138369 A1* | 5/2013 | Papana | .............. | G01R 31/3644 702/63 |
| 2013/0311119 A1 | 11/2013 | Tamezane Shigeto | | |
| 2015/0022158 A1 | 1/2015 | Osawa et al. | | |
| 2017/0214266 A1* | 7/2017 | Takahashi | ............. | H02J 7/0068 |

FOREIGN PATENT DOCUMENTS

| | | |
|---|---|---|
| CN | 104330739 A | 2/2015 |
| CN | 104535933 A | 4/2015 |
| CN | 105071449 A | 11/2015 |
| CN | 105607008 A | 5/2016 |
| CN | 105738822 A | 7/2016 |
| DE | 102010050980 A1 | 6/2011 |
| JP | 2009031219 A | 2/2009 |
| WO | WO2016113481 A1 | 7/2016 |

OTHER PUBLICATIONS

The Extended European search report dated Mar. 14, 2018 for European application No. 17194626.2, 7 pages.

* cited by examiner

METHOD AND APPARATUS FOR CALCULATING SOC OF A BATTERY BEING CHARGED AND BATTERY PACK INCLUDING THE APPARATUS

CROSS-REFERENCE TO RELATED APPLICATION

This application is based upon and claims priority to Chinese Patent Application No. 201610892592.1, filed on Oct. 13, 2016, the content of which is incorporated herein by reference in its entirety.

FIELD

The present disclosure relates to a field of batteries, battery management, and electromobiles, and more particularly to a method and an apparatus for calculating a SOC of a battery being charged and a battery pack including the apparatus.

BACKGROUND

With the development of the industrial technology, the battery is applied in more and more fields as a power source. SOC (State of Charge) is a ratio of the remaining capacity of a battery at a certain discharging rate to a rated capacity under the same conditions. A battery management system may calculate the SOC to be displayed to a user. The user may know a charging progress of the battery by viewing the displayed SOC when charging the battery.

Now, an ampere-hour method and an open-circuit voltage method are generally adopted to calculate the SOC. The ampere-hour method calculates the SOC by measuring the capacity that is charged into and discharged from the battery in real time by integral, and keeping recording and monitoring the capacity of the battery for a long time. However, the ampere-hour method does not take the state of the battery into account, which may cause an error between the calculated SOC and the actual SOC. The open-circuit voltage method requires the battery to stand for a long time until the battery reaches a voltage stability state, so as to calculate an accurate SOC. However, in the process of using the open-circuit voltage method to calculate the SOC of the battery, the time for the battery to stand to reach the voltage stability state may not be determined accurately. As a result, the voltage is often calculated when the battery has not reached the voltage stability state yet, and thus there may be a large error between the calculated SOC and the actual SOC. In this case, due to a larger calculated SOC, a phenomenon that the battery cannot be fully charged may occur in the process of battery charge. For example, when the actual SOC is 97% but the calculated SOC is 100%, it is assumed that the battery has been fully charged since the calculated SOC is 100%, and thus the charging of the battery is stopped. But in fact, the battery is not fully charged. On the other hand, due to a smaller calculated SOC, the SOC to be displayed to the user may abruptly change in the process of battery charge. For example, the actual SOC is 99%, but the calculated SOC is 96%. After that, when the actual SOC reaches 100%, the battery may assume that the calculated SOC of the battery is 100%. As a result, the displayed SOC may jump from 96% to 100%.

SUMMARY

A method and an apparatus for calculating a SOC of a battery being charged and a battery pack including the apparatus are provided by embodiments of the present disclosure.

In a first aspect, the present disclosure provides a method for calculating a SOC of a battery being charged. The method includes obtaining a full charge voltage and a reference charging voltage curve of the battery, wherein the reference charging voltage curve at least includes an approximately linear ascent stage; taking a voltage value from the approximately linear ascent stage of the reference charging voltage curve as a preset reference voltage, and obtaining a reference SOC corresponding to the preset reference voltage; obtaining a charging voltage curve corresponding to a current charging state of the battery, and acquiring a current charging voltage at which the charging voltage curve enters into an approximately linear ascent stage; determining a compensation factor according to the preset reference voltage, the full charge voltage, and the current charging voltage; and utilizing the compensation factor and the reference SOC to calculate a current SOC corresponding to the current charging state of the battery, wherein the compensation factor is utilized to convert a voltage difference between the current charging voltage and the preset reference voltage into a SOC difference between the current SOC and the reference SOC.

In a second aspect, the present disclosure provides an apparatus for calculating a SOC of a battery being charged. The apparatus includes a first obtaining module, configured to obtain a full charge voltage and a reference charging voltage curve of the battery, wherein the reference charging voltage curve at least includes an approximately linear ascent stage; a second obtaining module, configured to take a voltage value from the approximately linear ascent stage of the reference charging voltage curve as a preset reference voltage, and obtain a reference SOC corresponding to the preset reference voltage; a third obtaining module, configured to obtain a charging voltage curve corresponding to a current charging state of the battery, and acquire a current charging voltage at which the charging voltage curve enters into an approximately linear ascent stage; a factor determination module, configured to determine a compensation factor according to the preset reference voltage, the full charge voltage, and the current charging voltage; a calculation module, configured to utilize the compensation factor and the reference SOC to calculate a current SOC corresponding to the current charging state of the battery, wherein the compensation factor is utilized to convert a voltage difference between the current charging voltage and the preset reference voltage into a SOC difference between the current SOC and the reference SOC.

In a third aspect, the present disclosure provides a battery pack including the above apparatus for calculating the SOC of the battery being charged.

BRIEF DESCRIPTION OF THE DRAWINGS

To provide a better understanding of the present disclosure, the detailed description is described in conjunction with the accompanying figures, wherein same or similar reference numerals represent same or similar features, in which.

DETAILED DESCRIPTION

Figure 1:
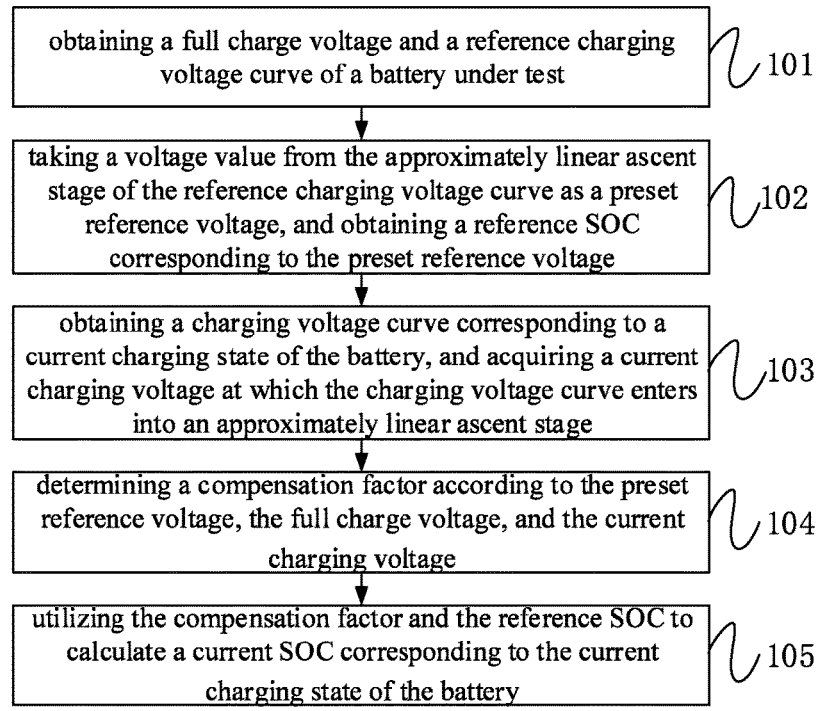
FIG. 1 is a flow chart illustrating a method for calculating a SOC of a battery being charged according to an embodiment of the present disclosure.

Various aspects of features and exemplary embodiments of the present disclosure will be described in detail in the following. In the detailed description below, numerous specific details are set forth to provide a thorough understanding of the present disclosure. However, it is obvious to those skilled in the art that the present disclosure can be practiced without some of these specific details. The description of embodiments below is merely to provide a better understanding of the present disclosure by illustrating examples of the present disclosure. The present disclosure is not limited to any specific configuration and algorithm as described below, but instead, covers any modification, replacement and improvement to elements, components, and algorithms without departing from the spirit of the present disclosure. In the drawings and the following description, well known structures and technologies are not illustrated, in order to avoid obscuring the present disclosure.

When a battery is being charged, a SOC is calculated in the process of battery charge, and the calculated SOC of the battery is displayed, in order to allow a user to visually know the current SOC of the battery. The battery as mentioned in the present disclosure may be a battery applied to various devices, including but not limited to a battery of a mobile phone, a battery of an electromobile and the like. In order to obtain a more accurate current SOC in the process of battery charge, a compensation factor is introduced, which may convert a voltage difference between a current charging voltage and a preset reference voltage into a SOC difference between the current SOC and a reference SOC. In the process of calculating the current SOC, the calculated current SOC may be compensated, so that the calculated current SOC is more accurate and has a smaller error as compared to the actual current SOC of battery.

FIG. 1 is a flow chart illustrating a method for calculating a SOC of a battery being charged according to an embodiment of the present disclosure. As shown in FIG. 1, the method for calculating a SOC of a battery being charged according to the embodiment of the present disclosure includes step 101-step 105.

In step 101, a full charge voltage and a reference charging voltage curve of a battery under test are obtained.

Figure 2:
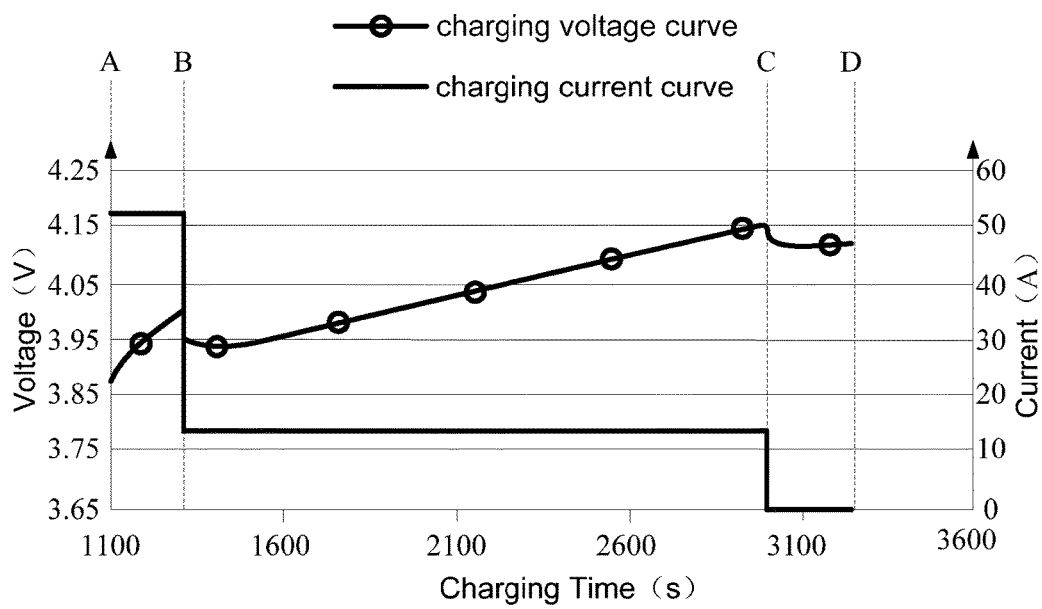
FIG. 2 is a schematic diagram illustrating a charging voltage curve and a charging current curve of a battery being charged in stages according to an embodiment of the present disclosure.

Here, the full charge voltage is the voltage of the battery under test when it is fully charged. The voltage of the battery under test is monitored to obtain the reference charging voltage curve which represents the voltage variation of the battery over time during the charging process. The reference charging voltage curve can be an arbitrary charging voltage curve of the battery obtained by monitoring the battery during any charging process. The reference charging voltage curve includes at least an approximately linear ascent stage in which the value of the charging voltage of the battery increases almost linearly. FIG. 2 is a schematic diagram illustrating a charging voltage curve and a charging current curve of the battery being charged in stages according to an embodiment of the present disclosure. In FIG. 2, the horizontal axis represents the accumulated charging time, the left vertical axis represents the value of the charging voltage, and the right vertical axis represents the value of the charging current. The charging process of the battery is divided into three stages, namely, a quick charging stage, a slow charging stage and a charging termination stage. As shown in FIG. 2, the stage AB is the quick charging stage, the stage BC is the slow charging stage, and the stage CD is the charging termination stage. As can be seen from the figure, the charging voltage of the battery under test in the stage BC keeps increasing almost linearly over the charging time. That is, the stage BC is the approximately linear ascent stage of the charging voltage curve. In the approximately linear ascent stage, the SOC also increases almost linearly. The approximately linear ascent stage of the charging voltage curve corresponds to a stage in which the battery under test is about to be fully charged. For example, when the SOC is in a range of 90% to 100%, the charging voltage of the battery falls into the approximately linear ascent stage of the charging voltage curve.

In step 102, a voltage value from the approximately linear ascent stage of the reference charging voltage curve is taken as a preset reference voltage, and a reference SOC corresponding to the preset reference voltage is obtained.

For example, as shown in FIG. 2, the voltage range of 3.95V to 4.15V corresponds to the approximately linear ascent stage, and thus the voltage of 4.05V may be selected as the preset reference voltage. It is noted that the preset reference voltage may be set according to charging capability of the battery itself and application scenarios of the battery. The reference SOC corresponding to the preset reference voltage may be calculated with prior art methods, such as the ampere-hour method or the open-circuit voltage method, etc.

In step 103, a charging voltage curve corresponding to the current charging state of the battery under test is obtained, and a current charging voltage at which the charging voltage curve enters into an approximately linear ascent stage is acquired.

For example, it is assumed that the charging voltage curve shown in FIG. 2 is the charging voltage curve corresponding to the current charging state of the battery under test. Given the current time is 2600 s, the approximately linear ascent stage has began and it can be read from the charging voltage curve that the current charging voltage is 4.10V.

In step 104, a compensation factor is determined according to the preset reference voltage, the full charge voltage, and the current charging voltage.

Here, the compensation factor may be calculated according to the relationship among voltage values of the preset reference voltage, the full charge voltage, and the current charging voltage.

In step 105, a current SOC corresponding to the current charging state of the battery under test is calculated based on the compensation factor and the reference SOC.

Here, the compensation factor represents a ratio of a voltage difference between the current charging voltage and the preset reference voltage to a voltage difference between the full charge voltage and the preset reference voltage. The compensation factor may be used to convert the voltage difference between the current charging voltage and the preset reference voltage into a SOC difference between the current SOC and the reference SOC. The compensation factor may compensate the SOC difference between a SOC of 100% and the reference SOC. Since the preset reference voltage and the current charging voltage are both in the approximately linear ascent stage, the preset reference voltage and the current charging voltage may not abruptly change, but keep stable and accurate. Therefore, the compensation factor may be utilized to convert an accurate voltage difference into a corresponding accurate SOC difference, so as to reduce the error between the calculated current SOC and the actual current SOC. Then the calculated current SOC to be displayed to the user may be corrected effectively by compensating the error between the calculated current SOC and the actual current SOC.

With the disclosed method for calculating the SOC of the battery being charged, the compensation factor may be determined in accordance with the full charge voltage of the battery, the preset reference voltage and the current charging voltage at which the charging voltage curve corresponding to the current charging state of the battery enters into the approximately linear ascent stage. The compensation factor may convert the voltage difference between the current charging voltage and the preset reference voltage into the SOC difference between the current SOC and the reference SOC. Then, the current SOC of the battery may be calculated with the compensation factor and the reference SOC. Since both the current charging voltage and preset reference voltage of the battery fall into the approximately linear ascent stage of the charging voltage curve of the battery, they may not abruptly change, but keep stable. Based on the stable current charging voltage and preset reference voltage, an accurate compensation factor may be determined, and then an accurate SOC may be obtained by compensation with the accurate compensation factor. In this way, the accuracy of the calculated SOC of the battery being charged may be improved. According to embodiments of the present disclosure, both a situation that the battery may not be fully charged due to the calculated current SOC much larger than the actual current SOC and a situation that the current SOC to be displayed to the user may abruptly change due to the calculated current SOC much smaller than the actual current SOC may be avoided. As a result, the user experience of viewing the current SOC during the charging process may be effectively improved.

In a specific embodiment, the step 104 may be implemented by determining the compensation factor as a ratio of a voltage difference between the current charging voltage and the preset reference voltage to a voltage difference between the full charge voltage and the preset reference voltage, which may be calculated by the formula below.

$$a=(V_d-V_p)/(V_e-V_p) \qquad (1)$$

Here, a is the compensation factor, $V_d$ is the current charging voltage, $V_p$ is the preset reference voltage, and $V_e$ is the full charge voltage.

In an embodiment, after determining the compensation factor, the determined compensation factor a and the reference SOC are utilized to calculate the current SOC corresponding to the current charging state of the battery under test in step 105. The step 105 may be implemented by utilizing the compensation factor to compensate the SOC difference between a SOC of 100% and the reference SOC so as to obtain a compensated SOC difference; and calculating the current SOC corresponding to the current charging state of the battery under test as a sum of the reference SOC and the compensated SOC difference. Specifically, the current SOC $SOC_d$ corresponding to the current charging state of the battery under test may be calculated according to the formula below.

$$SOC_d=SOC_p+(100\%-SOC_p) \times a \qquad (2)$$

Here, the $SOC_p$ is the reference SOC.

With both formulas (1) and (2) as above set forth, the current SOC $SOC_d$ corresponding to the current charging state of the battery under test may be calculated accurately. In an embodiment of the present disclosure, the reference SOC $SOC_p$ may be obtained by utilizing prior art methods for calculating the SOC, such as the ampere-hour method or the open-circuit voltage method. In this way, there may be a large error in the obtained reference SOC $SOC_p$. In order to improve the accuracy of the calculated current SOC $SOC_d$, the obtained current charging voltage $V_d$, the preset reference voltage $V_p$ and the full charge voltage $V_e$, which are relatively stable and accurate, are utilized to calculate the compensation factor a. Then the compensation factor a is utilized to compensate the $(100\%-SOC_p)$ in the formula. In this way, the overall error in the calculated current SOC $SOC_d$ may be reduced, and thus the accuracy of the calculated current SOC may be improved by compensating the calculated current SOC $SOC_d$. As an example, in an embodiment of the present disclosure, when the $SOC_p$ which is calculated by using prior art methods for calculating the SOC is small, the compensation factor a may be multiplied with the $(100\%-SOC_p)$ to appropriately increase the SOC difference between the current SOC and the reference SOC, so that the calculated current SOC $SOC_d$ may be compensated and the accuracy of the calculated current SOC may be improved. As another example, in an embodiment of the present disclosure, when the $SOC_p$ which is calculated by using prior art methods for calculating the SOC is large, the compensation factor a may be multiplied with the $(100\%-SOC_p)$ to appropriately reduce the SOC difference between the current SOC and the reference SOC, so that the calculated current SOC $SOC_d$ may be compensated and the accuracy of the calculated current SOC may be improved.

For example, assume the preset reference voltage is 4.050V, the reference SOC is 84.14%, the full charge voltage is 4.150V, and the charging voltage currently measured is 4.100V. In this example, the calculated current SOC which is calculated by using the method for calculating SOC of the present disclosure is 92.07%, while the actual current SOC is 92.75%. In contrast, the current SOC which corresponds to the current charging voltage (4.100V) and is calculated by using a prior art method for calculating SOC is 88.53%. It can be seen from the data above that, the error between the current SOC which is calculated by using the method for calculating SOC of the present disclosure and the actual current SOC is smaller than the error between the current SOC which is calculated by using the prior art method for calculating SOC and the actual current SOC. In other words, the current SOC which is calculated by using the method for calculating SOC of the present disclosure is more accurate.

In specific implementations, if the battery under test described above includes only one cell, the current charging voltage of the cell may be regarded as the current charging voltage of the battery under test; if the battery under test described above includes a plurality of cells, the highest charging voltage among current charging voltages of all of the plurality of cells may be regarded as the current charging voltage of the battery under test.

Figure 3:
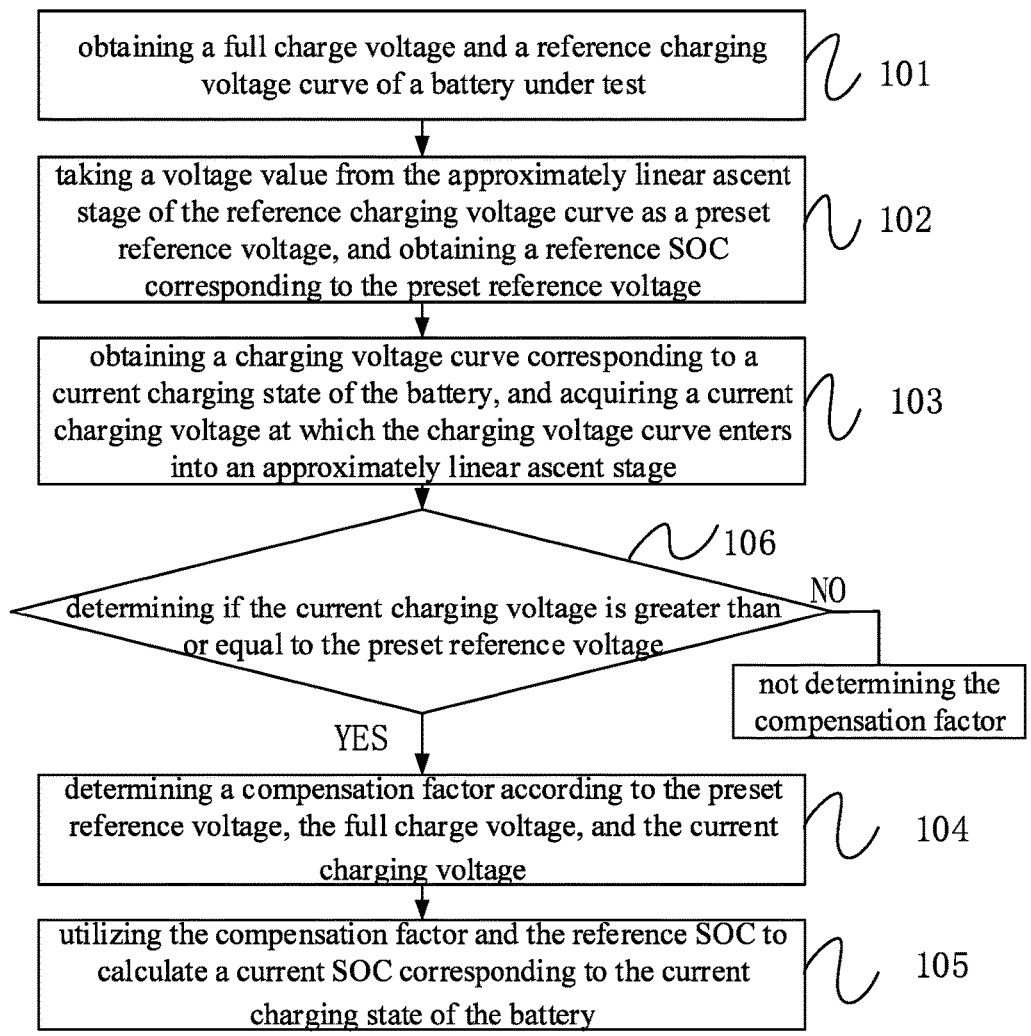
FIG. 3 is a flow chart illustrating a method for calculating a SOC of a battery being charged according to another embodiment of the present disclosure.

The calculation of SOC may often be inaccurate in a stage during which the battery under test is about to be fully charged. The stage may correspond to the approximately linear ascent stage of the charging voltage curve. For example, the stage during which the SOC of the battery under test is 90%-100% may be regarded as the stage during which the battery under test is about to be fully charged, and correspond to the approximately linear ascent stage of the charging voltage curve. Therefore, in order to save resources, it is not necessary to perform the above method for calculating the SOC during the entire approximately linear ascent stage. In view of this, another method for calculating the SOC of the battery being charged is provided by another embodiment of the present disclosure. FIG. 3 is a flow chart illustrating a method for calculating a SOC of a battery being charged according to another embodiment of the present disclosure. The steps 101-105 in FIG. 3 are same as the steps 101-105 of the method for calculating the SOC of the battery being charged as shown in FIG. 1, and the difference is that the method of FIG. 3 further includes step 106.

In step 106, it is determined whether the current charging voltage is greater than or equal to the preset reference voltage.

Here, when the current charging voltage is greater than or equal to the preset reference voltage, the steps 104-105 are performed. That is, it is not necessary to determine the compensation factor and then calculate the current SOC of the battery with the compensation factor during the entire approximately linear ascent stage. The steps 104-105 may be performed only when the current charging voltage is greater than or equal to the preset reference voltage, so that computing resources occupied by the steps 104-105 may be saved. When the current charging voltage is smaller than the preset reference voltage, a prior art method for calculating the SOC, such as the ampere-hour method, may be utilized to calculate the current SOC.

Figure 4:
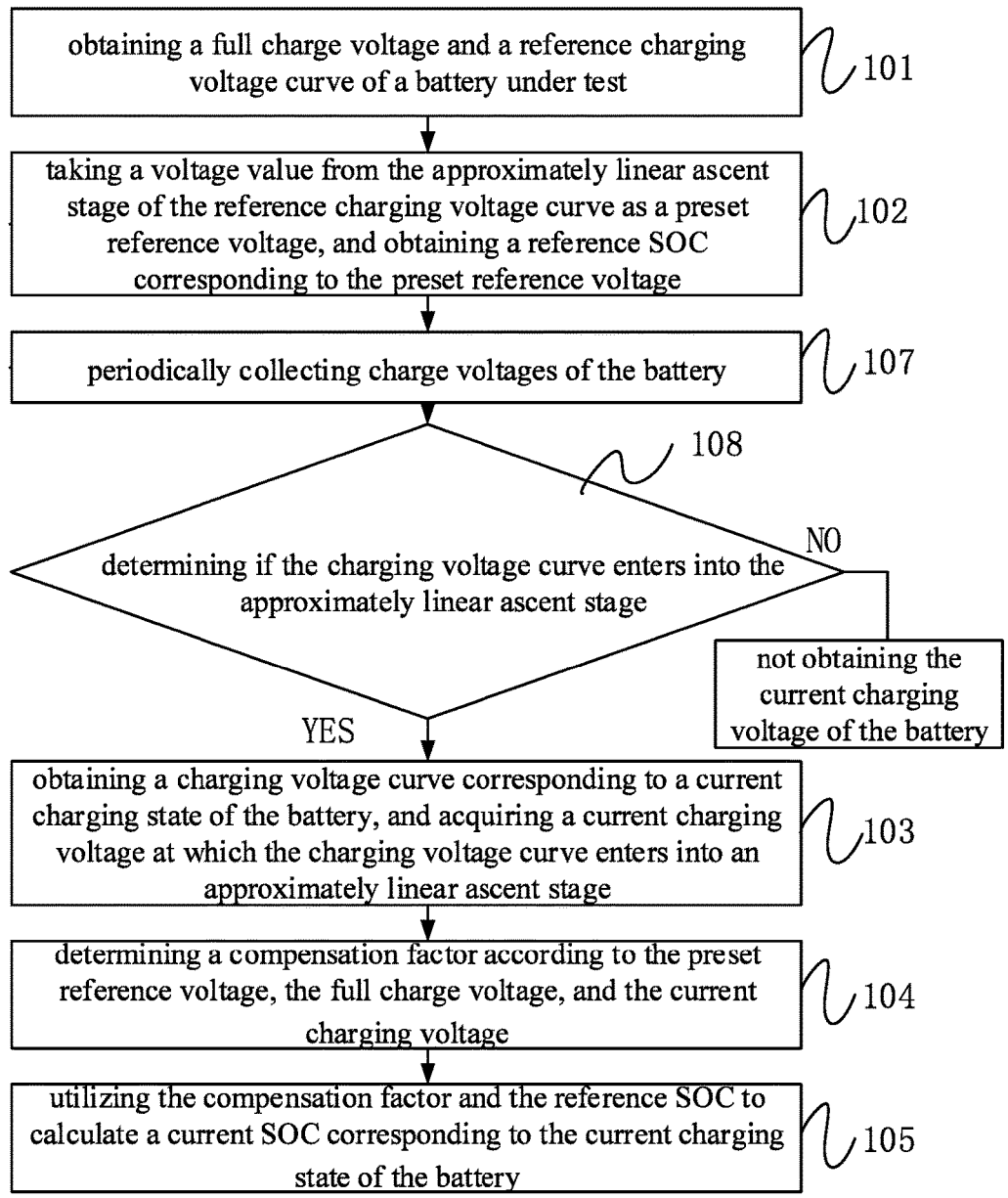
FIG. 4 is a flow chart illustrating a method for calculating a SOC of a battery being charged according to yet another embodiment of the present disclosure.

Furthermore, FIG. 4 is a flow chart illustrating a method for calculating a SOC of a battery being charged according to yet another embodiment of the present disclosure. The steps 101-105 in FIG. 4 are same as the steps 101-105 of the method for calculating the SOC of the battery being charged as shown in FIG. 1, and the difference is that the method of FIG. 4 further includes steps 107-108 for determining whether the current charging voltage of the battery under test is in the approximately linear ascent stage.

In step 107, the charging voltage of the battery under test is periodically collected.

Here, the period for periodically collecting the charging voltage of the battery may be set according to factors such as the charging capability of the battery under test, the application scenarios of the battery under test, and the like.

In step 108, it is determined whether the charging voltage curve of the battery under test enters into the approximately linear ascent stage, according to the periodically collected charging voltage of the battery under test.

Generally, it may be difficult to accurately determine the time when the charging voltage curve of the battery enters into the approximately linear ascent stage. So an increasing pattern of the charging voltage may be first detected from each periodically collected charging voltage of the battery under test, and then the detected increasing pattern of the charging voltage may be utilized to facilitate determining whether the charging voltage curve of the battery under test enters into the approximately linear ascent stage. When it is determined that the charging voltage curve of the battery enters into the approximately linear ascent stage, the step 103 may be performed to obtain the current charging voltage of the battery. On the other hand, when it is determined that the charging voltage curve does not enter into the approximately linear ascent stage, the step 103 may not be performed, and the method may continue to periodically collect the charging voltage of the battery until a plurality of periodically collected charging voltages show an approximate linearly increasing pattern. For example, the charging voltage of the battery may be collected every 50 milliseconds. If the increasing pattern of a plurality of periodically collected charging voltages is an approximate linearly increasing pattern, it may be determined that the charging voltage of the battery under test increases almost linearly.

It should be noted that in the process of applying the methods for calculating the SOC of the battery being charged according to the above embodiments to a charging process of a battery, when the charging voltage of the battery under test equals to the full charge voltage, the SOC of the battery under test is 100%, which represents that the battery is fully charged, and at this moment, the battery stops charging. After the battery has stopped charging, a conventional calculation method, such as the ampere-hour method or the open-circuit voltage method and the like, may be adopted to calculate the SOC of the battery so as to prevent a large error in the calculation of the SOC due to an unstable voltage of the battery under test.

It should be noticed that the temporal relation between the step 102 and the step 103 in the embodiments described above is not limited. The step 102 may be performed before, after, or along with the step 103. FIG. 1, FIG. 3 and FIG. 4 merely show exemplary implementations, and other implementations also fall into the scope of protection of the present disclosure.

Figure 5:
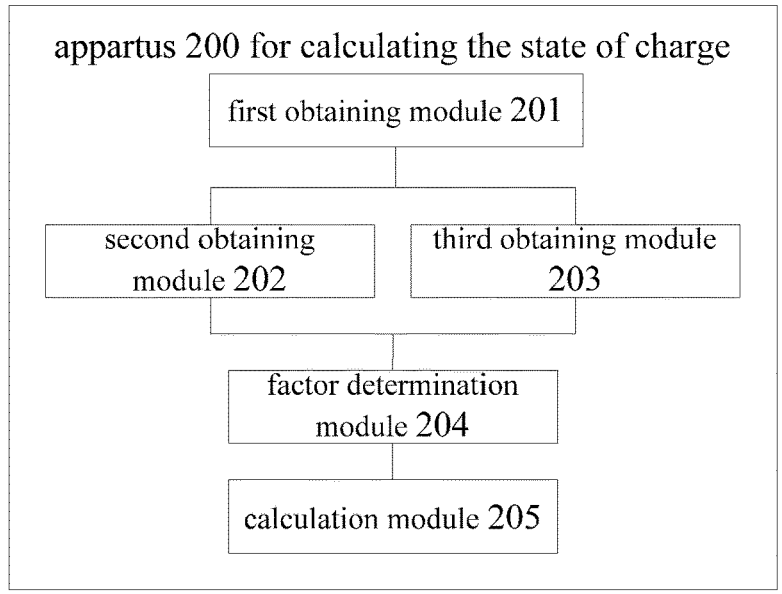
FIG. 5 is a structural schematic diagram illustrating an apparatus for calculating a SOC of a battery being charged according to an embodiment of the present disclosure.

FIG. 5 is a structural schematic diagram illustrating an apparatus for calculating a SOC of a battery being charged according to an embodiment of the present disclosure. As shown in FIG. 5, the apparatus 200 for calculating the SOC of the battery being charged includes a first obtaining module 201, a second obtaining module 202, a third obtaining module 203, a factor determination module 204 and a calculation module 205.

The first obtaining module 201 may be configured to obtain a full charge voltage and a reference charging voltage curve of a battery under test, wherein the reference charging voltage curve at least includes an approximately linear ascent stage. The second obtaining module 202 may be configured to take a voltage value from the approximately linear ascent stage of the reference charging voltage curve as a preset reference voltage, and obtain a reference SOC corresponding to the preset reference voltage. The third obtaining module 203 may be configured to obtain a charging voltage curve corresponding to the current charging state of the battery under test, and acquire the current charging voltage at which the charging voltage curve enters into an approximately linear ascent stage. The factor determination module 204 may be configured to determine a compensation factor according to the preset reference voltage, the full charge voltage, and the current charging voltage. The calculation module 205 may be configured to utilize the compensation factor and the reference SOC to calculate a current SOC corresponding to the current charging state of the battery under test. The compensation factor represents a ratio of a voltage difference between the current charging voltage and the preset reference voltage to a voltage difference between the full charge voltage and the preset reference voltage, and may be used to convert the voltage difference between the current charging voltage and the preset reference voltage into a SOC difference between the current SOC and the reference SOC. The compensation factor may compensate the SOC difference between a SOC of 100% and the reference SOC.

With the disclosed apparatus for calculating the SOC of the battery being charged, the compensation factor may be determined in accordance with the full charge voltage of the battery, the preset reference voltage and the current charging voltage at which the charging voltage curve corresponding to the current charging state of the battery enters into the approximately linear ascent stage. The compensation factor may convert the voltage difference between the current charging voltage and the preset reference voltage into the SOC difference between the current SOC and the reference SOC. Then, the current SOC of the battery may be calculated with the compensation factor and the reference SOC. Since both the current charging voltage and preset reference voltage of the battery fall into the approximately linear ascent stage of the charging voltage curve of the battery, they may not abruptly change, but keep stable. Based on the stable current charging voltage and preset reference voltage, an accurate compensation factor may be determined, and then an accurate SOC may be obtained by compensation with the accurate compensation factor. In this way, the accuracy of the calculated SOC of the battery being charged may be improved. According to embodiments of the present disclosure, both a situation that the battery may not be fully charged due to the calculated current SOC much larger than the actual current SOC and a situation that the current SOC to be displayed to the user may abruptly change due to the calculated current SOC much smaller than the actual current SOC may be avoided. As a result, the user experience of viewing the current SOC during the charging process may be effectively improved.

In a preferred embodiment of the present disclosure, the factor determination module 204 described above may be further configured to determining the compensation factor as a ratio of a voltage difference between the current charging voltage and the preset reference voltage to a voltage difference between the full charge voltage and the preset reference voltage.

In a preferred embodiment of the present disclosure, the factor determination module 204 described above may be further configured to utilize the compensation factor to compensate the SOC difference between a SOC of 100% and the reference SOC so as to obtain a compensated SOC difference; and calculate the current SOC corresponding to the current charging state of the battery under test as a sum of the reference SOC and the compensated SOC difference.

Figure 6:
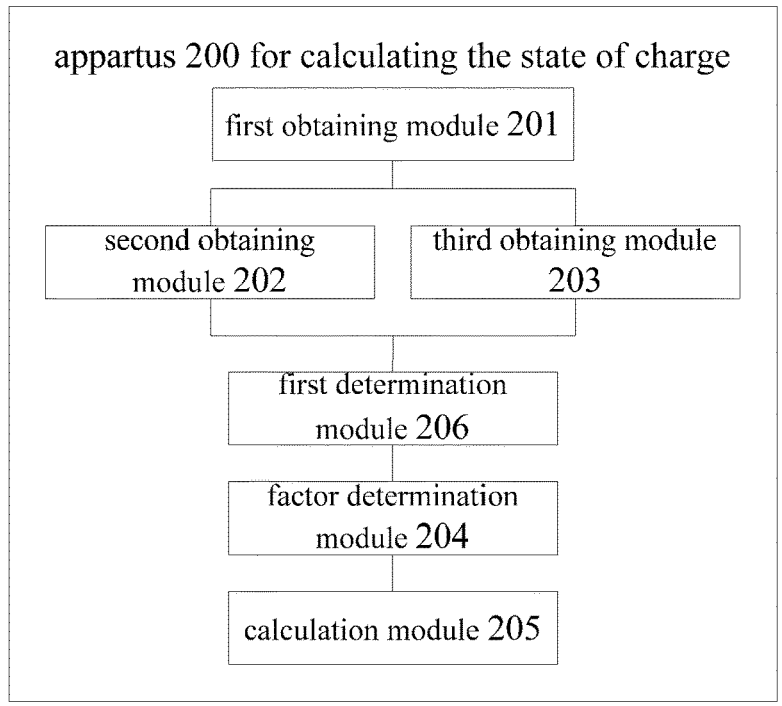
FIG. 6 is a structural schematic diagram illustrating an apparatus for calculating a SOC of a battery being charged according to another embodiment of the present disclosure.

In a preferred embodiment of the present disclosure, in order to save computing resources occupied by the calculation of the current SOC, the apparatus 200 for calculating the SOC of the battery being charged according to the embodiments described above may further include a first determination module 206. FIG. 6 is a structural schematic diagram illustrating an apparatus 200 for calculating a SOC of a battery being charged according to another embodiment of the present disclosure. As shown in FIG. 6, the first determination module 206 may be configured to determine whether the current charging voltage is greater than or equal to the preset reference voltage; and the factor determination module 204 described above may be further configured to determine the compensation factor according to the preset reference voltage, the full charge voltage, and the current charging voltage, when the first determination module 206 determines that the current charging voltage is greater than or equal to the preset reference voltage.

Figure 7:
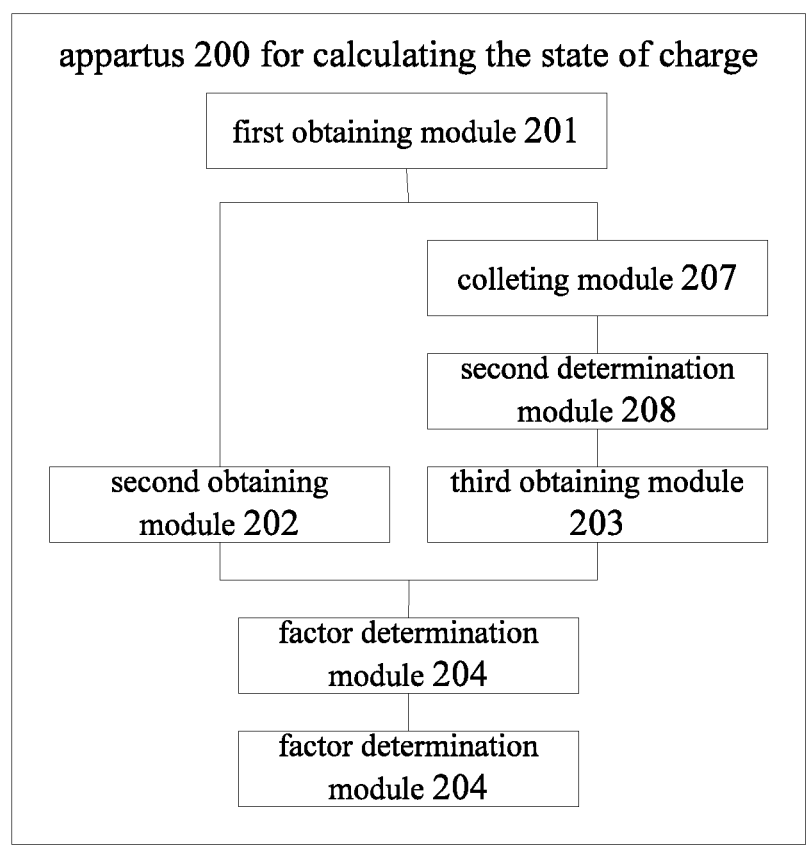
FIG. 7 is a structural schematic diagram illustrating an apparatus for calculating a SOC of a battery being charged according to yet another embodiment of the present disclosure.

In order to determine whether the charging voltage curve of the battery under test enters into the approximately linear ascent stage, the apparatus 200 for calculating the SOC of the battery being charged may further include a collecting module 207 and a second determination module 208. FIG. 7 is a structural schematic diagram illustrating an apparatus 200 for calculating a SOC of a battery being charged according to yet another embodiment of the present disclosure. As shown in FIG. 7, the collecting module 207 may be configured to periodically collect a charging voltage of the battery under test; and the second determination module 208 may be configured to determine whether the charging voltage curve of the battery under test enters into the approximately linear ascent stage, according to the periodically collected charging voltages of the battery under test.

In specific implementations, the battery under test may include one or more cells. If the battery under test includes one cell, the current charging voltage of the battery under test may be the charging voltage of the cell. If the battery under test includes a plurality of cells, the current charging voltage of the battery under test may be the highest charging voltage among current charging voltages of all of the plurality of cells.

An embodiment of the present disclosure may further provide a battery pack, including the apparatus for calculating the SOC of the battery being charged according to the embodiments described above. Since the advantages of the battery pack are substantially same as those of the apparatus for calculating the SOC of the battery being charged according to the embodiments described above, they are not repeated here. Specifically, the battery pack according to the embodiments of the present disclosure may be installed in various electric devices such as an electromobile, a mobile phone and the like.

The functional modules shown in the structural block diagram described above may be implemented as hardware, software, firmware, or a combination thereof. When implemented as hardware, it may be, for example, electronic circuits, application specific integrated circuits (ASICs), suitable firmware, plug-ins, function cards, and so forth. When implemented as software, the element of the present disclosure is a program or a code segment used to perform the required task. The program or code segment may be stored in a machine-readable medium or transmitted over a transmission medium or a communication link through a data signal carried in a carrier wave. The "machine-readable medium" may include any medium capable of storing or transmitting information. Examples of the machine-readable medium include electronic circuits, semiconductor memory devices, ROM, flash memory, erasable ROM (EROM), floppy disks, CD-ROMs, optical disks, hard disks, optical media, radio frequency (RF) links, and so forth. The code segment may be downloaded via a computer network such as Internet, intranet, or the like.

It should be clearly noted that the various embodiments in the specification are all described in a progressive manner. The same or similar parts of the embodiments may be referred to each other, and the difference of an embodiment from another embodiment has been illustrated in detail. In particular, for the apparatus embodiments, since it is substantially similar to the method embodiments, the description is relatively simple, and the relevant parts may be referred to the description of the method embodiment. The present disclosure is not limited to the specific steps and structures described above and shown in the drawings. For the purpose of brevity, a detailed description of known method techniques is omitted here.

The present disclosure may be embodied in other specific forms without departing from the spirit and essential features thereof. For example, algorithms described in specific embodiments may be modified while the system architecture does not depart from the basic spirit of the present disclosure. Accordingly, all aspects of the present embodiments are construed as illustrative, and not limiting. The scope of the present disclosure is defined by the appended claims, rather than the description above, and all changes that fall into the scope of meanings and equivalents of the claims are included within the scope of the present disclosure.

What is claimed is:

1. A method for calculating a SOC (State of Charge) of a battery being charged, the method being applied in a battery management system and comprising:
   obtaining a full charge voltage and a reference charging voltage curve of the battery, wherein the reference charging voltage curve at least comprises an approximately linear ascent stage;
   taking a voltage value from the approximately linear ascent stage of the reference charging voltage curve as a preset reference voltage, and obtaining a reference SOC corresponding to the preset reference voltage;
   obtaining a charging voltage curve by measuring voltage of the battery over time in a current charging state of the battery, and acquiring a current charging voltage at which the charging voltage curve enters into an approximately linear ascent stage;
   determining a compensation factor according to the preset reference voltage, the full charge voltage, and the current charging voltage;
   utilizing the compensation factor and the reference SOC to calculate a current SOC corresponding to the current charging state of the battery, wherein the compensation factor is utilized to convert a voltage difference between the current charging voltage and the preset reference voltage into a SOC difference between the current SOC and the reference SOC.

2. The method of claim 1, wherein, determining the compensation factor according to the preset reference voltage, the full charge voltage, and the current charging voltage comprises:
   determining the compensation factor as a ratio of the voltage difference between the current charging voltage and the preset reference voltage to a voltage difference between the full charge voltage and the preset reference voltage.

3. The method of claim 2, wherein, utilizing the compensation factor and the reference SOC to calculate the current SOC corresponding to the current charging state of the battery comprises:
   utilizing the compensation factor to compensate a SOC difference between a SOC of 100% and the reference SOC so as to obtain a compensated SOC difference; and
   calculating the current SOC corresponding to the current charging state of the battery as a sum of the reference SOC and the compensated SOC difference.

4. The method of claim 1, further comprising:
   determining whether the current charging voltage is greater than or equal to the preset reference voltage; and
   performing the step for determining the compensation factor according to the preset reference voltage, the full charge voltage, and the current charging voltage, when it is determined that the current charging voltage is greater than or equal to the preset reference voltage.

5. The method of claim 1, further comprising: before acquiring the current charging voltage at which the charging voltage curve enters into the approximately linear ascent stage,
   periodically collecting charging voltages of the battery;
   determining whether the charging voltage curve of the battery enters into the approximately linear ascent stage, according to the periodically collected charging voltages of the battery.

6. The method of claim 1, wherein, the battery comprises a plurality of cells, and the current charging voltage of the battery is the highest charging voltage among current charging voltages of all of the plurality of cells.

7. An apparatus for calculating a SOC of a battery being charged, comprising:
   a first obtaining module, configured to obtain a full charge voltage and a reference charging voltage curve of the battery, wherein the reference charging voltage curve at least comprises an approximately linear ascent stage;
   a second obtaining module, configured to take a voltage value from the approximately linear ascent stage of the reference charging voltage curve as a preset reference voltage, and obtain a reference SOC corresponding to the preset reference voltage;
   a third obtaining module, configured to obtain a charging voltage curve corresponding to a current charging state of the battery, and acquire a current charging voltage at which the charging voltage curve enters into an approximately linear ascent stage;
   a factor determination module, configured to determine a compensation factor according to the preset reference voltage, the full charge voltage, and the current charging voltage;
   a calculation module, configured to utilize the compensation factor and the reference SOC to calculate a current SOC corresponding to the current charging state of the battery, wherein the compensation factor is utilized to convert a voltage difference between the current charging voltage and the preset reference voltage into a SOC difference between the current SOC and the reference SOC.

8. The apparatus of claim 7, wherein the factor determination module is further configured to:
   determine the compensation factor as a ratio of the voltage difference between the current charging voltage and the preset reference voltage to a voltage difference between the full charge voltage and the preset reference voltage.

9. The apparatus of claim 8, wherein the calculation module is further configured to:
   utilize the compensation factor to compensate a SOC difference between a SOC of 100% and the reference SOC so as to obtain a compensated SOC difference; and
   calculate the current SOC corresponding to the current charging state of the battery as a sum of the reference SOC and the compensated SOC difference.

10. The apparatus of claim 7, further comprising:
    a first determination module, configured to determine whether the current charging voltage is greater than or equal to the preset reference voltage, wherein
    the factor determination module is configured to determine the compensation factor according to the preset reference voltage, the full charge voltage, and the current charging voltage, when the first determination module determines that the current charging voltage is greater than or equal to the preset reference voltage.

11. The apparatus of claim 7, further comprising:
a colleting module, configured to periodically collect charging voltages of the battery; and
a second determination module, configured to determine whether the charging voltage curve enters into the approximately linear ascent stage, according to the periodically collected charging voltages of the battery.

12. The apparatus of claim 7, wherein the battery comprises a plurality of cells, and the current charging voltage of the battery is the highest charging voltage among current charging voltages of all of the plurality of cells.

13. A battery pack, comprising the apparatus for calculating the SOC of the battery being charged of claim 7.

* * * * *